United States Patent
Hutchison et al.

(10) Patent No.: US 6,414,847 B1
(45) Date of Patent: Jul. 2, 2002

(54) INTEGRAL DIELECTRIC HEATSPREADER

(75) Inventors: Brian R. Hutchison, Windsor; Matthew Schwiebert, Cupertino; Robert J. Thompson, Santa Rosa, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/829,453

(22) Filed: Apr. 9, 2001

(51) Int. Cl.⁷ .................................. H05K 7/20
(52) U.S. Cl. ............... 361/704; 361/707; 361/708; 361/713; 361/719; 361/760; 361/761; 257/706; 257/707; 257/713; 165/80.2; 165/185
(58) Field of Search ............... 361/704, 707, 361/709–711, 714–722, 760, 761, 792, 795; 257/700, 706, 707, 713, 774; 165/80.2, 185

(56) References Cited

U.S. PATENT DOCUMENTS

| | | | | |
|---|---|---|---|---|
| 5,576,934 A | * | 11/1996 | Roethlingshoefer et al. | 361/761 |
| 5,629,835 A | * | 5/1997 | Mahulikar et al. | 361/719 |
| 6,058,013 A | * | 5/2000 | Christopher et al. | 361/704 |
| 6,154,364 A | * | 11/2000 | Girrens et al. | 361/704 |
| 6,191,477 B1 | * | 2/2001 | Hashemi | 257/706 |
| 6,226,183 B1 | * | 5/2001 | Weber et al. | 361/704 |
| 6,301,114 B1 | * | 10/2001 | Ootani et al. | 361/704 |

* cited by examiner

Primary Examiner—Boris Ohervinsky
(74) Attorney, Agent, or Firm—Robert T. Martin

(57) ABSTRACT

Integral dielectric heatspreader for transferring heat from semiconductor devices. A semiconductor device is mounted to a thermally conductive electrically insulating substrate, which forms the integral dielectric heatspreader. The heatspreader is then mounted to a package or a lower cost substrate such as a printed circuit board. The integral dielectric heatspreader may also support integral transmission lines, resistors, capacitors, or other bulk components. Performance of the heatspreader is enhanced through the use of thermal vias on a printed circuit board.

19 Claims, 2 Drawing Sheets

INTEGRAL DIELECTRIC HEATSPREADER

BACKGROUND OF THE INVENTION

1. Field of the Invention

The present invention pertains to the field of microelectronic device packaging, more specifically, to packaging and mounting of heat dissipating microelectronic devices.

2. Art Background

Electronic systems typically include semiconductor devices which dissipate heat during normal operation. In RF and microwave electronics, examples include small compound devices such as Gallium Arsenide (GaAs) amplifiers and mixers. Many digital devices, such as prescalers and high speed integrated circuits also generate heat. Device performance and reliability is directly related to how efficiently heat can be extracted from them. An additional concern with RF and microwave devices is the necessity to carefully control the dimensions of conductors near the device, as these conductors affect performance of the system.

SUMMARY OF THE INVENTION

A dielectric heatspreader formed from a thermally conductive, electrically insulating substrate is used to mount high power semiconductor devices to a printed circuit board. The dielectric heatspreader may contain additional components and features such as passive components or transmission lines. The dielectric heatspreader provides thermal transfer between the semiconductor device and a printed circuit board. Thermal performance of the printed circuit board may be improved by providing thermal vias which provide additional heat transfer from the dielectric heatspreader.

BRIEF DESCRIPTION OF THE DRAWINGS

The present invention is described with respect to particular exemplary embodiments thereof and reference is made to the drawings in which.

DETAILED DESCRIPTION

Electronic systems typically include semiconductor devices which dissipate a significant amount of heat during normal operation. In RF and microwave electronics, examples include compound devices such as Gallium Arsenide (GaAs) devices such as amplifiers and mixers. Microprocessors and other high performance logic circuits may also dissipate substantial amounts of heat. Device performance and reliability is directly related to how efficiently heat can be extracted from them. An additional concern with RF and microwave devices is the necessity to carefully control the dimensions of conductors near the device, as these conductors affect performance of the system.

One prior art solution to the problem of thermal transfer from a semiconductor device is to mount the device in a larger package having high thermal conductivity. A device is mounted directly on the floor of a package made from a high thermal conductivity material such as copper, a copper alloy, aluminum, or ceramics. While such packages provide high thermal conductivity, they are expensive. Metal or ceramic packages must be produced one at a time, often by machining, and carefully assembled.

Another prior art solution is to attach the device directly to a printed circuit board by means of a thermally conductive epoxy. This approach has the disadvantage of the relatively low thermal conductivity of circuit board materials. While it is known to improve this thermal conductivity by using thermal vias under the device, overall thermal conductivity is still relatively low, due to the high heat flux concentrated by the relatively small device.

Another prior art solution is to attach the device directly to a large ceramic substrate using conductive epoxy or solder. Large ceramic substrates are expensive, far more expensive than laminated printed circuit boards. Additionally, ceramic circuits must be surrounded by a metal package, adding further cost.

Another prior art solution is to attach the device to a thin metal shim or pedestal with conductive epoxy or solder. The shim-device subassembly is then attached to the ceramic or laminate substrate. This approach causes difficulties with electrical performance, especially in RF and microwave environments. To provide a thermal enhancement, the shim must be somewhat larger than the device. This larger size requires that device interconnects such as wire bonds, ribbon bonds, or mesh bonds must reach over the edges of the metal shim. This increase in lead length increases the inductance of the leads, affecting circuit performance, especially at high frequencies.

Figure 1:
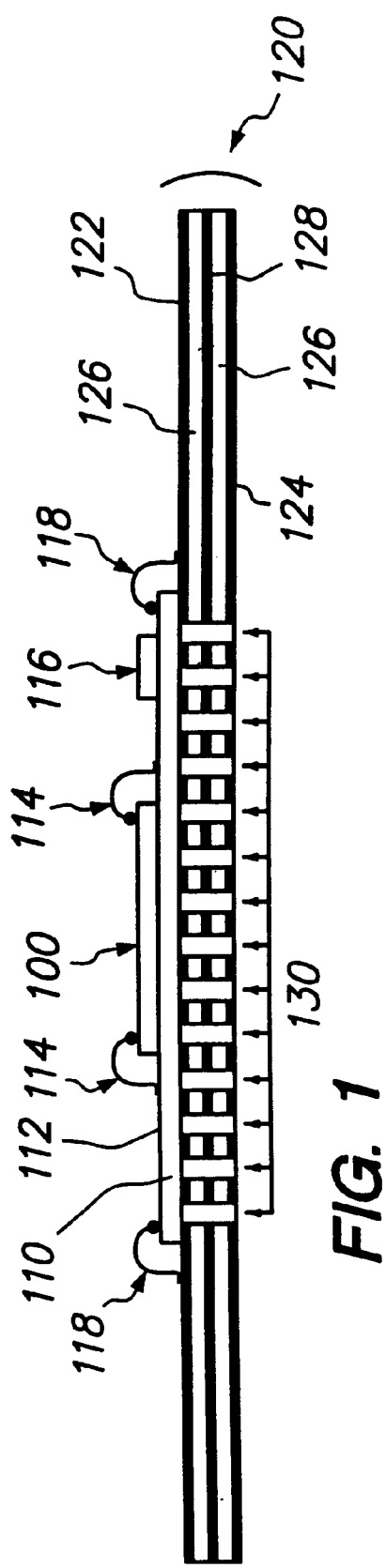
FIG. 1 shows a cross section of a dielectric headspreader.

FIG. 1 shows a first embodiment of the present invention. Semiconductor device 100 is mounted to integral dielectric headspreader 110, which reduces the overall thermal resistance of the overall package by spreading the heat generated by semiconductor 100 over a larger area. Heatspreader 110 is further mounted to printed circuit board 120.

In the preferred embodiment, heatspreader 110 is made from a thermally conductive, electrically insulating material such as Beryllium Oxide (BeO). Other suitable dielectric materials include Sapphire, Aluminum Nitride (AlN), high resistivity Silicon, chemical vapor deposited diamond, silicon carbide (SiC), boron nitride (BN) and other materials known to the art.

Semiconductor device 100, which in the RF and microwave arts includes devices such as power amplifiers, Gallium Arsenide (GaAs) devices, mixers, and the like, or high speed digital logic devices, is mounted to integral dielectric heatspreader 110 using 80Au/20Sn solder, or an adhesive. Conductive adhesives, such as silver epoxy, may be used where electrical conductivity is important.

While integral dielectric headspreader 110 provides a thermal expansion coefficient closely matching that of semiconductor device 100, which improves overall reliability, heatspreader 110 also supports integral transmission lines, networks, resistors, capacitors, and other devices near device 100, which improves circuit density and performance. Conductive traces and bonding pads are placed, by depositing and patterning thin films or other means known to the art, on top surface 112 of heatspreader 110. Bonding wires 114 provide electrical connections between device 100 and these bonding pads and conductive traces, which may include connections to bulk components 116. Techniques such as wire bonding, mesh bonding, and ribbon bonding may be used.

The combination of device 100 and integral dielectric heatspreader 110 is further mounted to a package, such as printed circuit board 120. As shown in FIG. 1, printed circuit board 120 has conductive layers 122, 124, and 128, separated by an insulating material 126, such as fiberglass, or in the case of RF and microwave circuitry, a low-dielectric material such as epoxy glass, or woven glass reinforced with PTFE or ceramics. Printed circuit board 120 as shown in FIG. 1 represents a three layer board. Integral dielectric heatspreader 110 is mounted to printed circuit board 120 using solder or adhesive. While a copper layer 122 immediately beneath integral dielectric heatspreader 110 is not required, it is used in the preferred embodiment as it further decreases the overall thermal resistance of the system. Bonding wires 118 provide electrical connections between conductive features on heatspreader 110 and conductive layer 122 of printed circuit board 120.

The thermal efficiency of the system may be further increased through the use of thermal vias 130. Vias are conductive structures formed in printed circuit boards for providing electrical connections between conductive traces and features on different layers of the printed circuit board. By placing a number of vias in printed circuit board 120 under integral dielectric heatspreader 110, the efficiency of the heat sink system is improved by providing a thermal path of lower thermal resistance. The thermal resistance of a standard hollow via may be lowered by filling it with a material such as epoxy or solder, or by replacing the hollow via with one of solid copper or suitable thermally conductive material.

As it is common in multilayer printed circuit board design to use one or more internal conductive layers as a ground plane, bonding thermal vias 130 to such a conductive layer, such as conductive layer 128, increases the effective area of the heat sink, further spreading the heat laterally through printed circuit board 120. Thermal vias 130 may be connected to multiple conductive layers, such as 128 and 124.

Additional heat sinking may be provided by contacting thermal vias 130 to a suitable heat sink.

Figure 2:
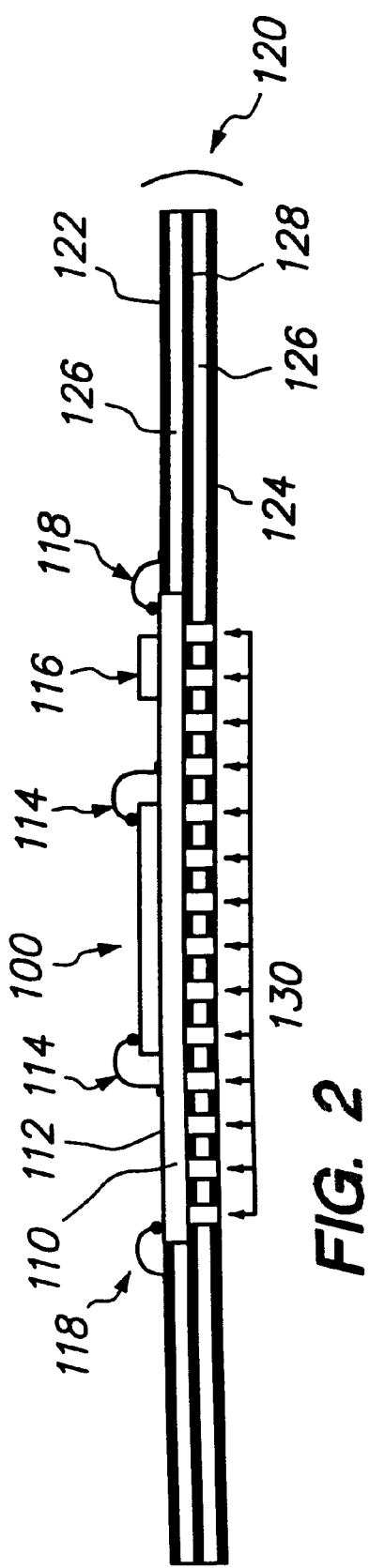
FIG. 2 shows a cross section of a second embodiment of a dielectric heatspreader.

FIG. 2 shows a cross section of a second embodiment of the invention. In this embodiment, top copper layer 122 and a portion of insulating material 126 of printed circuit board 120 have been removed so that integral dielectric heatspreader 110 is recessed. This places top surface 112 of integral dielectric heatspreader 110 at approximately the same level as the top surface 122 of printed circuit board 120. This has the effect of providing a common ground plane between top surface 122 of printed circuit board 120 and top surface 112 of heatspreader 110, and of further shortening electrical bonds 118 from conductive pads on surface 112 of heatspreader 110 to conductive features on top copper layer 122 of printed circuit board 120. Removal of material may be performed by means known to the art, including but not limited to laser milling. In the preferred embodiment, heatspreader 110 contacts conductive layer 128 of printed circuit board 120.

Figure 3:
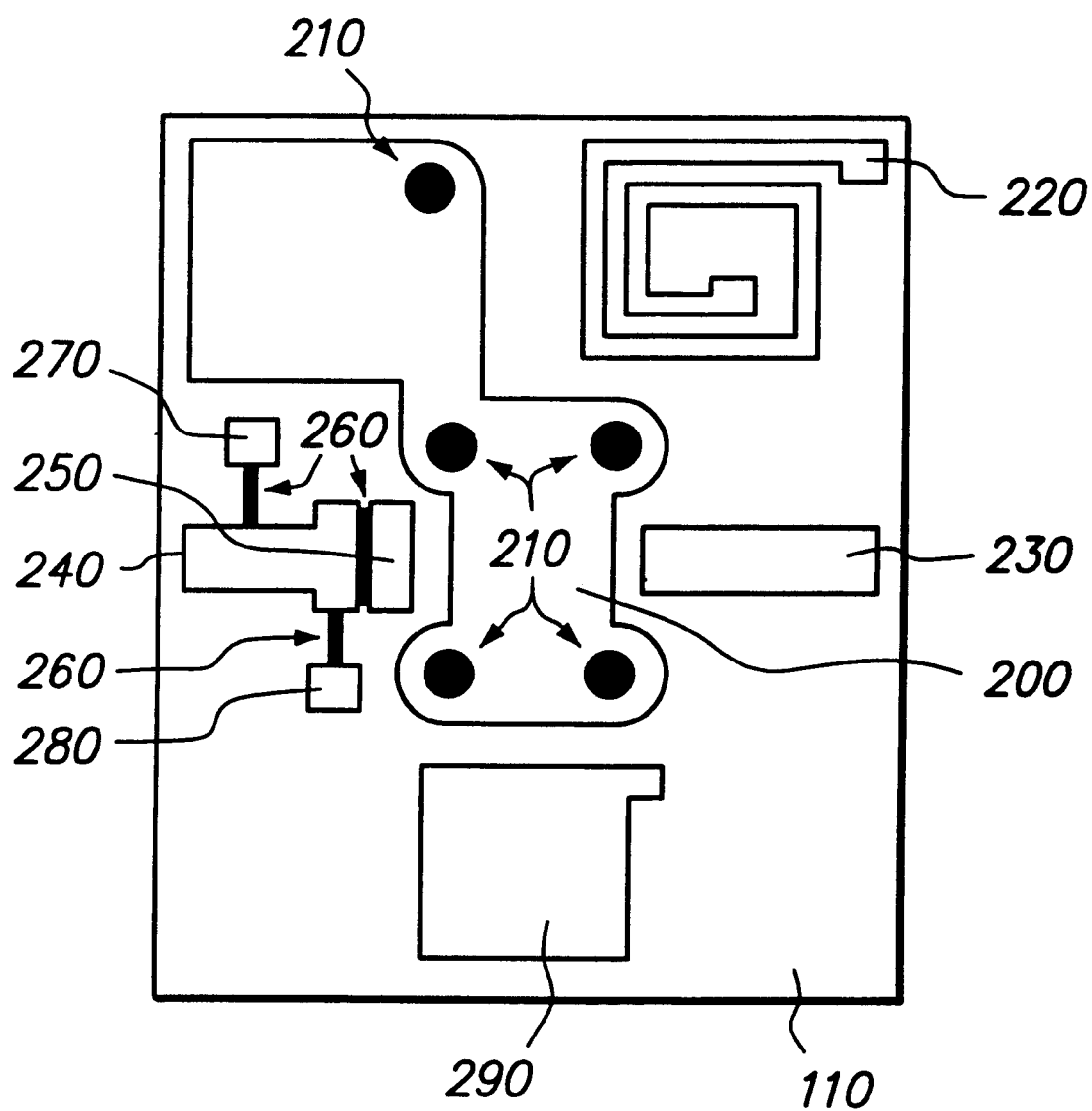
FIG. 3 shows a top view of a dielectric headspreader.

FIG. 3 shows a top view of a dielectric heatspreader in accordance with the present invention. In the preferred embodiment, heatspreader 110 is made from Beryllium Oxide (BeO). The heat-generating semiconductor device, an HFET amplifier, mounts at position 200. Features 210 are conductive vias. Feature 220 is an inductor. Feature 230 is an output tuned circuit for the amplifier. Features 240 and 250 are input tuned circuits, with features 260 being resistors deposited on heatspreader 110. Wire bonds connect tuned circuit 240 to circuitry external to heatspreader 110. Wire bonds then run from tuned circuit 250 to the input of the HFET amplifier mounted at position 200. Wire bonds run from the output of the HFET amplifier mounted at position 200 to output tuned circuit 230. Further wire bonds run from output tuned circuit 230 to external circuitry. A wire bond connects output tuned circuit 230 to one end of inductor 220. The other end of inductor 220 is wire bonded to external circuitry. Features 270 and 280 are bonding pads. Feature 290 is a mounting pad for a capacitor, which is connected using wire bonds to output tuned circuit 230 and bonding pad 280. Feature 300 provides a mounting pad for an additional capacitor, which is wire bonded to pad 270.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. An integral dielectric heatspreader for mounting a semiconductor device on a secondary surface, the heatspreader comprising a thermally conductive, electrically insulating material having:

a first central area for mounting the semiconductor device on a first surface of the heatspreader, and at least one conductive pad on the first surface of the heatspreader for accepting electrical connections from the semiconductor device to the conductive pad, and from the conductive pad to the secondary surface.

2. The integral dielectric heatspreader of claim 1 where the heatspreader is made from Beryllium Oxide.

3. The integral dielectric heatspreader of claim 1 where the heatspreader is made from Aluminum Nitride.

4. The integral dielectric heatspreader of claim 1 where the heatspreader is made from Silicon.

5. The integral dielectric heatspreader of claim 1 where the heatspreader is made from diamond.

6. The integral dielectric heatspreader of claim 1 where the heatspreader is made from sapphire.

7. The integral dielectric heatspreader of claim 1 where one or more traces are integrated onto the first surface of the heatspreader.

8. The integral dielectric heatspreader of claim 7 where one or more traces are impedance-controlled transmission lines.

9. The integral dielectric heatspreader of claim 1 where passive components are integrated onto the first surface of the heatspreader.

10. A method of mounting a semiconductor device comprising:

mounting the device to an integral dielectric heatspreader, the heatspreader containing at least one conductive feature, mounting the heatspreader on a secondary surface where the secondary surface contains a plurality of conducting layers, and connecting the device to at least one conductive feature on the secondary surface via at least one conductive feature on the heatspreader.

11. The method of claim 10 where the integral dielectric heatspreader contains one or more conductive traces.

12. The method of claim 10 where one or more traces are impedance-controlled transmission lines.

13. The method of claim 10 where at least one passive component is integrated onto the heatspreader surface.

14. The method of claim 10 where the heatspreader is mounted to a conductive layer of the secondary surface.

15. The method of claim 10 where the conductive layer of the secondary surface is a recessed layer.

16. The method of claim 10 where the heatspreader is mounted in a recess on the secondary surface.

17. The method of claim 10 where the heatspreader is mounted over thermal vias in the secondary surface.

18. The method of claim 15 where the thermal vias are connected to a conductive surface.

19. The method of claim 15 where the conductive surface is an internal conductive layer of the secondary surface.

* * * * *